United States Patent
Nakamura

(10) Patent No.: US 11,869,814 B2
(45) Date of Patent: Jan. 9, 2024

(54) METHOD OF MANUFACTURING SILICON CARBIDE SEMICONDUCTOR DEVICE

(71) Applicant: FUJI ELECTRIC CO., LTD., Kawasaki (JP)

(72) Inventor: Hidetatsu Nakamura, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 143 days.

(21) Appl. No.: 17/681,536

(22) Filed: Feb. 25, 2022

(65) Prior Publication Data

US 2022/0336296 A1 Oct. 20, 2022

(30) Foreign Application Priority Data

Apr. 15, 2021 (JP) .................................. 2021-068880

(51) Int. Cl.
*H01L 21/66* (2006.01)
*H01L 21/784* (2006.01)
(Continued)

(52) U.S. Cl.
CPC ............ *H01L 22/20* (2013.01); *H01L 21/784* (2013.01); *H01L 29/1608* (2013.01); *H01L 29/7813* (2013.01)

(58) Field of Classification Search
None
See application file for complete search history.

(56) References Cited

U.S. PATENT DOCUMENTS

| 2015/0262892 A1 | 9/2015 | Sugimoto et al. |
| 2019/0165102 A1 | 5/2019 | Fujimoto |

(Continued)

FOREIGN PATENT DOCUMENTS

| JP | 5791830 B2 | 10/2015 |
| JP | 5980024 B2 | 8/2016 |

(Continued)

OTHER PUBLICATIONS

"SiC Semiconductor Product Quality Management System for Identifying Defect Generating Processes", Toshiba review, vol. 73, No. 2, Mar. 2018 (partial translation of p. 45, middle paragraph).

*Primary Examiner* — Jack S Chen
(74) *Attorney, Agent, or Firm* — Rabin & Berdo, P.C.

(57) ABSTRACT

Types, sizes, and locations of crystal defects of an epitaxial layer of a semiconductor wafer containing silicon carbide are detected. Next, a predetermined device element structure is formed and based on location information of the crystal defects of the semiconductor wafer, semiconductor chips free of crystal defects and semiconductor chips containing only extended defects (Frank dislocations, carrot defects) are identified as conforming product candidates among individual semiconductor chips cut from the semiconductor wafer while semiconductor chips containing foreign particle defects and triangular defects are removed as non-conforming chips. Next, electrical characteristics of all the semiconductor chips that are conforming product candidates are checked. Next, based on a conforming product standard obtained in advance, a standard judgment is performed for all the semiconductor chips that are conforming product candidates, whereby semiconductor chips that are conforming products are identified.

7 Claims, 7 Drawing Sheets

(51) Int. Cl.
  *H01L 29/16* (2006.01)
  *H01L 29/78* (2006.01)

(56) References Cited

U.S. PATENT DOCUMENTS

2022/0367274 A1* 11/2022 Nakamura .......... H01L 29/7827
2022/0367294 A1* 11/2022 Nakamura ............ H01L 23/544
2022/0367642 A1* 11/2022 Kagoyama .............. H01L 22/12

FOREIGN PATENT DOCUMENTS

| JP | 2018-101650 A | 6/2018 |
| JP | 2019-102493 A | 6/2019 |
| JP | 2019-192859 A | 10/2019 |
| JP | 2020-031076 A | 2/2020 |

* cited by examiner

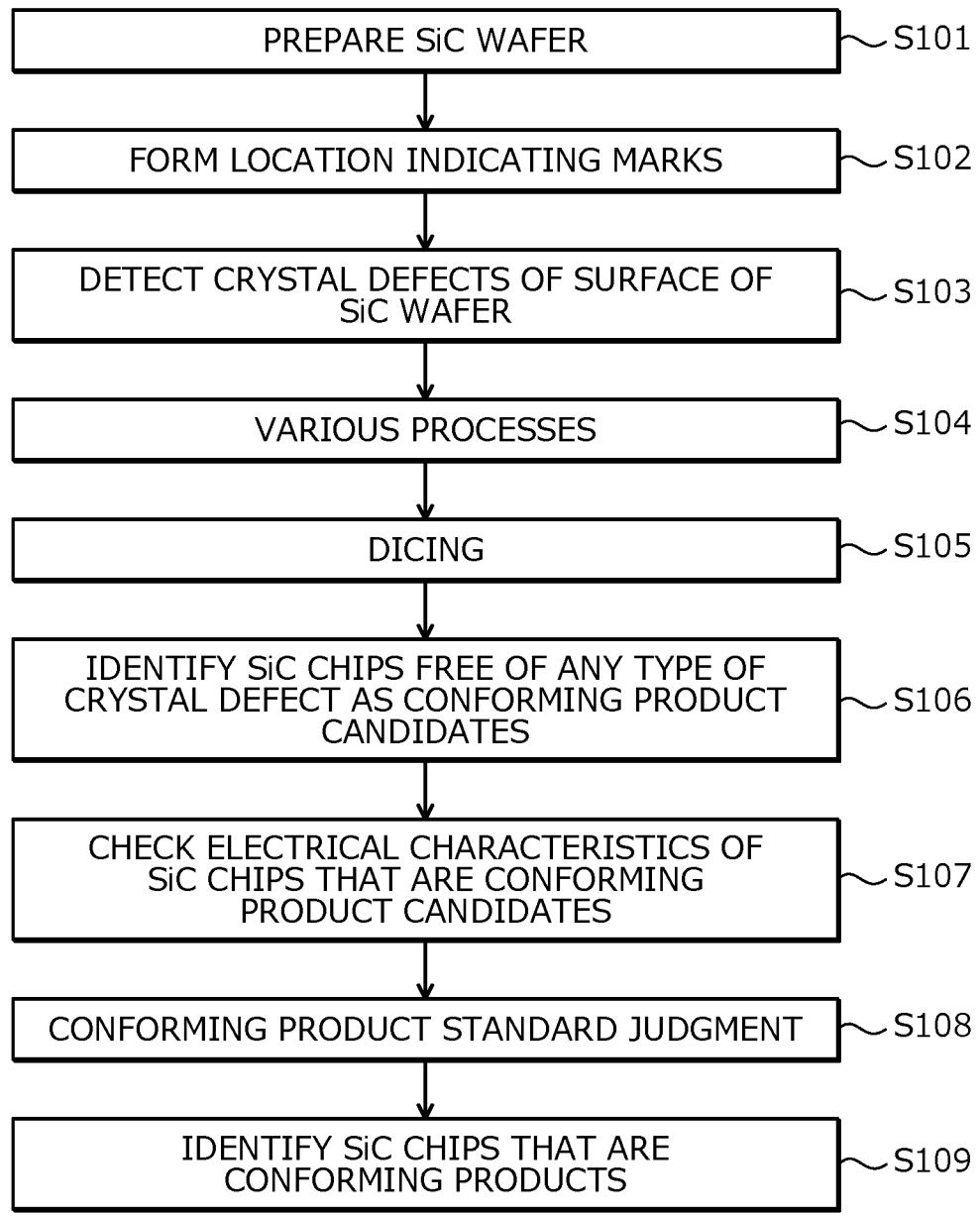

METHOD OF MANUFACTURING SILICON CARBIDE SEMICONDUCTOR DEVICE

CROSS REFERENCE TO RELATED APPLICATIONS

This application is based upon and claims the benefit of priority of the prior Japanese Patent Application No. 2021-068880, filed on Apr. 15, 2021, the entire contents of which are incorporated herein by reference.

BACKGROUND OF THE INVENTION

1. Field of the Invention

Embodiments of the invention related to a method of manufacturing a silicon carbide semiconductor device.

2. Description of the Related Art

Conventionally, to evaluate reliability of a silicon carbide semiconductor device (semiconductor chip) containing silicon carbide (SiC) as a semiconductor material, crystal defects of surfaces and inside a semiconductor wafer (SiC wafer) are detected by crystal defect inspection equipment (for example, SiC Wafer Inspection and Review System SICA88 manufactured by Lasertec Corporation), whereby a non-conforming chip among individual semiconductor chips cut from the semiconductor wafer is identified. Semiconductor chips containing a crystal defect detected by the crystal defect inspection equipment are all regarded to be non-conforming chips without exception, without performing an electrical characteristics test or regardless of electrical characteristics test results.

A method of manufacturing a conventional silicon carbide semiconductor device is described. FIG. 7 is a flowchart depicting an outline of the method of manufacturing a conventional silicon carbide semiconductor device. First, a semiconductor wafer (SiC wafer) containing silicon carbide as a semiconductor material is prepared (step S101). The semiconductor wafer is an epitaxial wafer in which an epitaxial layer is epitaxially grown on a starting wafer containing silicon carbide. Next, at an epitaxial layer surface (main surface) of the semiconductor wafer, marks (hereinafter, location indicating marks) for indicating locations (coordinates in directions parallel to wafer surface) of crystal defects of the semiconductor wafer are formed (step S102).

Next, by crystal defect inspection equipment, crystal defects of the epitaxial layer of the semiconductor wafer are detected and location information, etc. of the crystal defects is obtained based on the location indicating marks formed by the process at step S102 (step S103). In the process at step S103, downfalls and large pits generated during epitaxial growth of the epitaxial layer and caused by foreign particle contamination, carbon (C) inclusion, etc.; triangular defects caused by polymorph (crystalline polymorph) inclusion; and Frank dislocations and carrot defects caused by threading screw dislocations (TSDs) are detected.

Next, in each chip region (region constituting a semiconductor chip) of the semiconductor wafer, various processes for forming a predetermined device element structure are performed (step S104). Next, the semiconductor wafer is cut (diced), whereby each of the chip regions of the semiconductor wafer becomes an individual semiconductor chip (SiC chip) (step S105). Next, based on the location information obtained by the process at step S103, a semiconductor chip completely free of the crystal defects detected by the process at step S103 is identified as a conforming product (conforming chip) candidate (step S106). A semiconductor chip containing even one crystal defect detected by the process at step S103 is removed as a non-conforming chip.

Next, for each semiconductor chip identified as a conforming product candidate by the process at step S106, a predetermined conduction test is performed and electrical characteristics are checked (step S107), and based on the results at step S107, it is determined whether a conforming product standard obtained in advance is satisfied (step S108). A conforming product standard is a limit value of any of various characteristics capable of ensuring a predetermined capability and predetermined reliability of the silicon carbide semiconductor device; the conforming product standard is obtained in advance. Thereafter, based on the results at step S108, semiconductor chips satisfying the conforming product standard are identified as conforming products (conforming chips) (step S109), whereby evaluation of the silicon carbide semiconductor device is completed.

As a method of manufacturing the conventional silicon carbide semiconductor device, a method has been proposed in which, of semiconductor chips determined to be a conforming product by a first withstand voltage test performed by applying a rated voltage, a semiconductor chip free of micropipes in the active region is evaluated in terms of electrical characteristics by an avalanche test while for a semiconductor chip containing a micropipe in the active region thereof, the electrical characteristics thereof are evaluated by a second withstand voltage test performed by applying a voltage higher than the rated voltage (for example, refer to Japanese Laid-Open Patent Publication No. 2020-031076). In Japanese Laid-Open Patent Publication No. 2020-031076, with respect to the semiconductor chips determined to be a conforming product by the first withstand voltage test, different evaluation tests are performed depending on the presence/absence of a micropipe and use of each of the semiconductor chips is determined according to the evaluation result.

SUMMARY OF THE INVENTION

According to an embodiment of the invention, a method of manufacturing a silicon carbide semiconductor device fabricated on each of a plurality of semiconductor chips formed by epitaxially growing an epitaxial layer on a starting substrate containing silicon carbide, the method including preparing, as a pre-process a semiconductor wafer in which the epitaxial layer is epitaxially grown on a starting wafer containing the silicon carbide and constituting the starting substrate; detecting a plurality of types of crystal defects of the epitaxial layer as a detection process; forming a device element structure in the semiconductor wafer as a formation process; dicing the semiconductor wafer into the plurality of semiconductor chips as a cutting process, the cutting process being performed after the formation process; identifying, as a first identification process, as a conforming product candidate, one or more first semiconductor chips that are free of one or more specific types of crystal defects among the plurality of types of crystal defects detected by the detection process; checking, as a checking process electrical characteristics of the one or more first semiconductor chips identified by the first identification process; and identifying, as a second identification process one or more second semiconductor chips to be a conforming product, from the one or more first semiconductor chips identified by the first identification process, the one or more second semiconductor chips being identified based on a result of the checking process and a predetermined standard obtained in advance.

Objects, features, and advantages of the present invention are specifically set forth in or will become apparent from the following detailed description of the invention when read in conjunction with the accompanying drawings.

BRIEF DESCRIPTION OF THE DRAWINGS

FIG. 7 is a flowchart depicting an outline of a method of manufacturing a conventional silicon carbide semiconductor device.

DETAILED DESCRIPTION OF THE INVENTION

Figure 1:
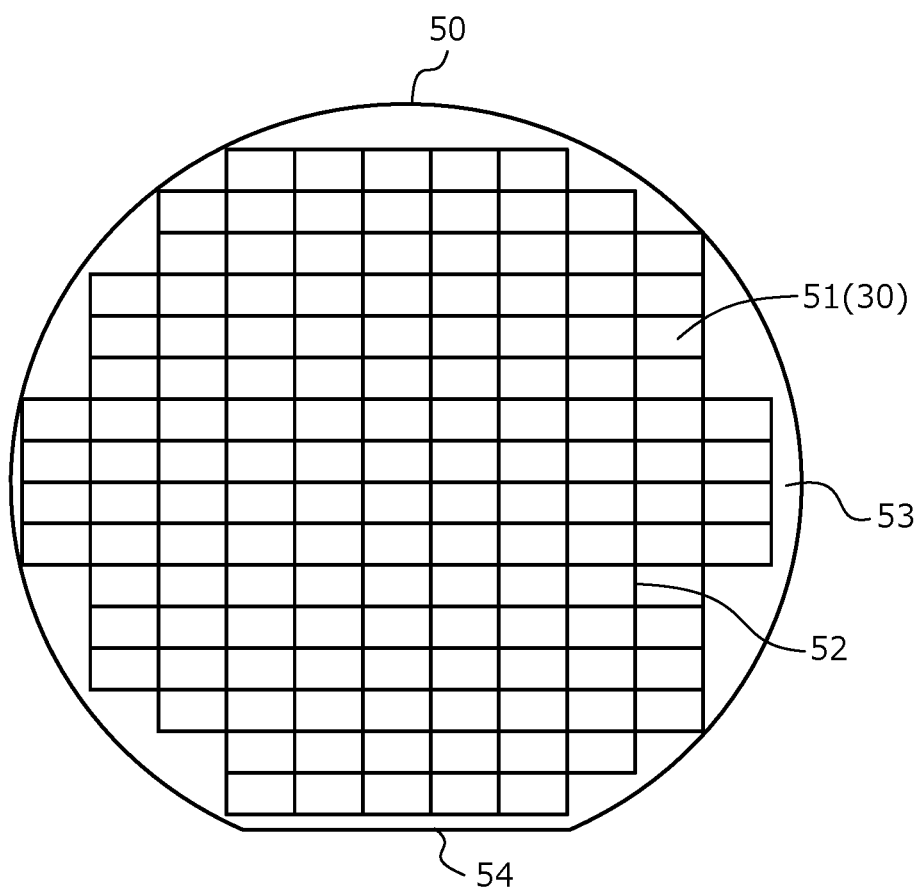
FIG. 1 is a plan view depicting a state when a semiconductor wafer manufactured by a method of manufacturing a silicon carbide semiconductor device according to an embodiment is viewed from a front side thereof.

First, problems associated with the conventional techniques are discussed. In the method of manufacturing the conventional silicon carbide semiconductor device described above (refer to FIG. 7), semiconductor chips containing even one crystal defect detected by the crystal defect inspection equipment are all removed as non-conforming chips. Therefore, in the process at step S106, the semiconductor chips removed as non-conforming chips include semiconductor chips having electrical characteristics enabling use as a conforming product. In this manner, a semiconductor chip that may be used as a conforming product is removed as a non-conforming chip, whereby the conforming product rate may decrease and chip cost may increase.

Embodiments of a method of manufacturing a silicon carbide semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical will be given the same reference numerals and will not be repeatedly described. Further, in the present description, when Miller indices are described, "−" means a bar added to an index immediately after the "−", and a negative index is expressed by prefixing "−" to the index.

A method of manufacturing a silicon carbide semiconductor device according to an embodiment, for example, is applicable to a Schottky barrier diode (SBD), a metal oxide semiconductor field effect transistor (MOSFET) having insulated gates with a 3-layered structure including a metal, an oxide film, and a semiconductor, etc., the method may be further applied to a pin (p-intrinsic-n) diode and an insulated gate bipolar transistor (IGBT).

Figure 2:
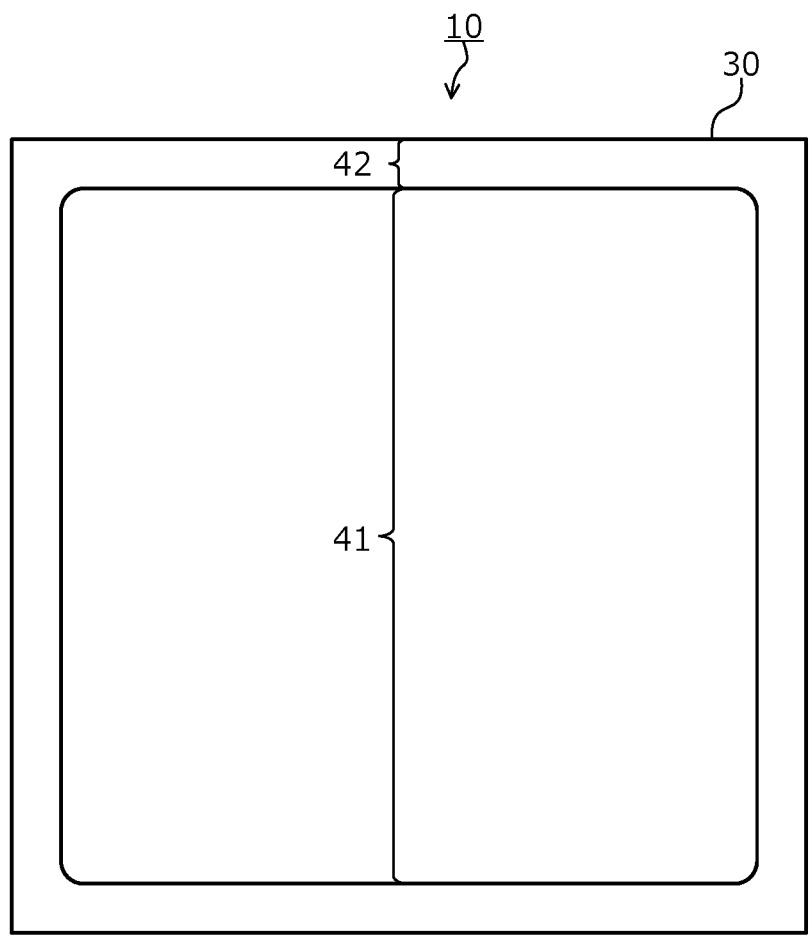
FIG. 2 is a plan view depicting a layout when a semiconductor chip cut from the semiconductor wafer in FIG. 1 is viewed from a front side thereof.
Figure 3:
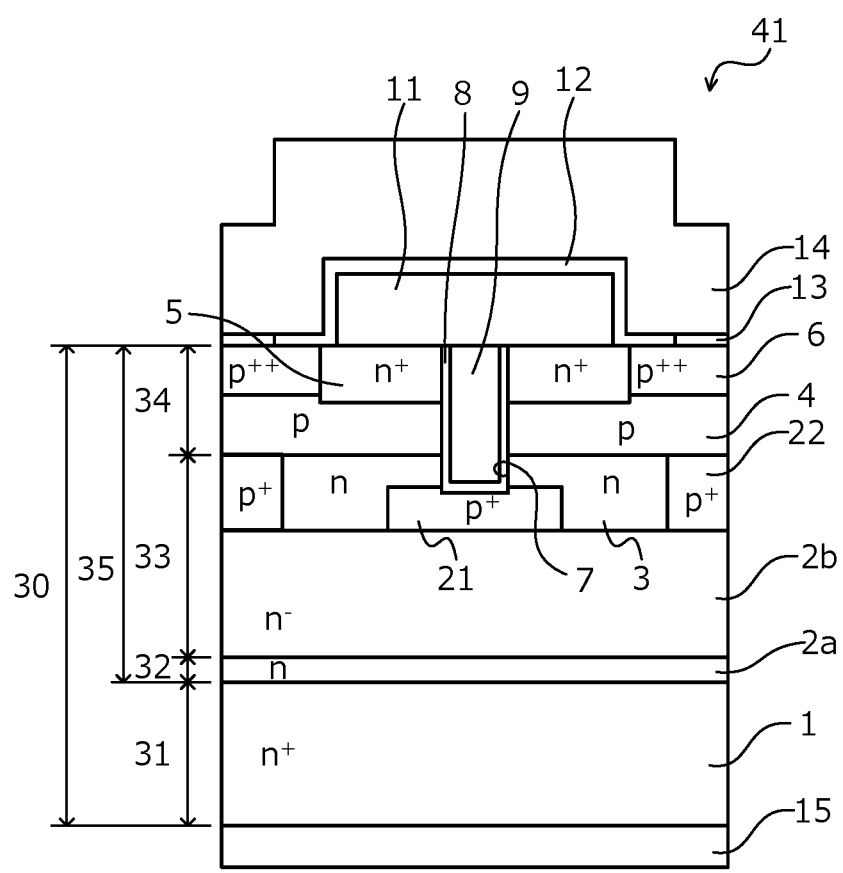
FIG. 3 is a cross-sectional view of an example of a structure of an active region in FIG. 2.

FIG. 1 is a plan view depicting a state when a semiconductor wafer manufactured by the method of manufacturing the silicon carbide semiconductor device according to the embodiment is viewed from a front side thereof. FIG. 2 is a plan view depicting a layout when a semiconductor chip cut from the semiconductor wafer in FIG. 1 is viewed from a front side thereof. FIG. 2 depicts a state of one chip region 51 after a semiconductor wafer 50 depicted in FIG. 1 is diced. FIG. 3 is a cross-sectional view of an example of a structure of an active region in FIG. 2. In FIG. 3, an n-channel-type vertical MOSFET having a trench gate structure is depicted as an example of the silicon carbide semiconductor device manufactured by the method of manufacturing the silicon carbide semiconductor device according to the embodiment.

Figure 4:
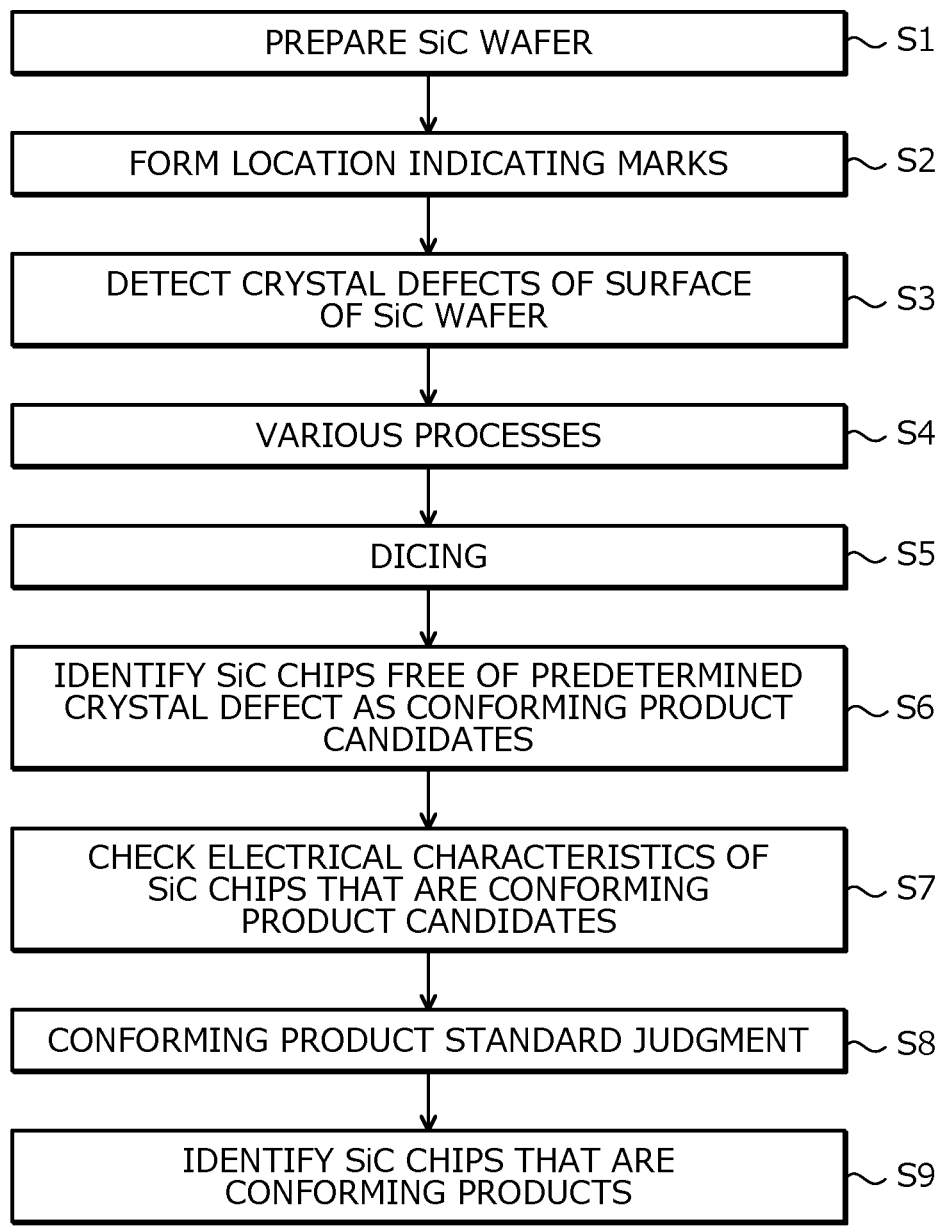
FIG. 4 is flowchart depicting an outline of the method of manufacturing the silicon carbide semiconductor device according to the embodiment.

A silicon carbide semiconductor device 10 according to the embodiment depicted in FIGS. 2 and 3, is fabricated (manufactured) by a general method of manufacturing (corresponds to processes at steps S4 and S5 in later-described FIG. 4) in each of the chip regions 51 (refer to FIG. 1) of the semiconductor wafer 50 containing silicon carbide (SiC) as a semiconductor material, and the chip regions 51 are cut into individual semiconductor chips (semiconductor substrates) 30. The semiconductor wafer 50 is formed by epitaxially growing an epitaxial layer 56 (refer to FIG. 5, portion constituting an epitaxial layer 35 in FIG. 3 after dicing) on an $n^+$-type starting wafer 55 (refer to FIG. 5, portion constituting an $n^+$-type starting substrate 31 in FIG. 3 after dicing) containing silicon carbide.

The semiconductor wafer 50 may have, for example, an orientation flat (straight cutout provided at a portion of the edge) 54 or a notch (V-shaped cutout provided at a portion of the edge, not depicted) indicating plane orientation. The chip regions 51 of the semiconductor wafer 50 are cut (diced) along dicing lines 52 into individual the semiconductor chips 30. All the semiconductor chips 30 cut from the same semiconductor wafer 50 have the same epitaxial layer 35 (refer to FIG. 3) and have the same device element structure (here, trench gate structure, refer to FIG. 3) formed by the same processes.

Each of the chip regions 51 has a substantially rectangular shape in a plan view thereof, the chip regions 51 being disposed in substantially a center of the semiconductor wafer 50 in a matrix-like pattern. The dicing lines 52 surround peripheries of the chip regions 51 in a grid-shaped pattern. The dicing lines 52 are grooves formed at a main surface (surface having the epitaxial layer 56 in FIG. 5) of the semiconductor wafer 50. In the dicing lines 52, marks (location indicating marks, not depicted) for indicating locations (coordinates) in directions parallel to the surface of the semiconductor wafer 50 are formed. The location indicating marks are markers for indicating positions of the chip regions 51, locations of crystal defects detected by a process at step S3 in later-described FIG. 4, and the like.

The location indicating marks, for example, are protrusions or recesses having a predetermined shape (for example, an X-shape) in a plan view and are formed by etching at the main surface (surface having the epitaxial layer 56 in FIG. 5)) of the semiconductor wafer 50, in the dicing lines 52. The location indicating marks may be provided in a non-operating region 53 of the semiconductor wafer 50. The non-operating region 53 is a portion not used as the semiconductor chips 30, between an end of the semiconductor wafer 50 and the chip regions 51 closest to the end of the semiconductor wafer 50. For the location indicating marks, an alignment mark for positioning (aligning) parts of the device element structure formed in each of the chip regions 51 may be used.

The silicon carbide semiconductor device 10 according to the embodiment depicted in FIGS. 2 and 3 is an n-channel-type vertical MOSFET having a trench gate structure in an active region 41 in the semiconductor chip 30 thereof containing silicon carbide. The active region 41 is a region through which a main current (drift current) flows when the MOSFET is ON and in which multiple unit cells (functional units of a device element) of the MOSFET and having the same structure are disposed adjacent to one another. In FIG. 3, one unit cell of the MOSFET is depicted. The active region 41, for example, is disposed in substantially a center of the semiconductor chip 30 and a periphery thereof is surrounded by an edge termination region 42.

The edge termination region 42 is a region between the active region 41 and the end of the semiconductor chip 30. The edge termination region 42 has a function of mitigating electric field of the front side of the semiconductor chip 30 and sustaining a withstand voltage. In the edge termination region 42, a voltage withstanding structure (not depicted) such as a field limiting ring (FLR:), junction termination extension (JTE) structure, or a guard ring is disposed. The withstand voltage is a voltage limit at which leak current does not increase excessively and no erroneous operation or destruction of the silicon carbide semiconductor device 10 occurs.

The trench gate structure is configured by a p-type base region 4, $n^+$-type source regions 5, $p^{++}$-type contact regions 6, trenches 7, gate insulating films 8, and gate electrodes 9. The semiconductor chip 30 is formed by epitaxially growing sequentially on a front surface of the $n^+$-type starting substrate 31 containing silicon carbide, epitaxial layers 32, 33, 34 (in FIG. 3, these epitaxial layers are collectively indicated by reference numeral 35) constituting an n-type buffer region 2a, an $n^-$-type drift region 2b, and the p-type base region 4. The semiconductor chip 30 has, as a front surface, a first main surface having the epitaxial layer 35 and, as a back surface, a second main surface having the $n^+$-type starting substrate 31 (back surface of the $n^+$-type starting substrate 31).

The $n^+$-type starting substrate 31 constitutes an $n^+$-type drain region 1. The n-type buffer region 2a has a function of preventing holes generated by a pn junction interface between the p-type base region 4 and the $n^-$-type drift region 2b from reaching the $n^+$-type starting substrate 31 by recombining the holes in the n-type buffer region 2a. Further, the n-type buffer region 2a has a function of suppressing expansion of stacking faults (triangular defects 62, Frank dislocations 64a, carrot defects 64b in later-described FIG. 5) in the epitaxial layers 33, 34 due to propagation of dislocations from the $n^+$-type starting substrate 31 to the epitaxial layer 35. The n-type buffer region 2a may be omitted.

The $n^-$-type drift region 2b is provided between and in contact with the p-type base region 4 and the n-type buffer region 2a (in an instance in which the n-type buffer region 2a is omitted, the $n^+$-type drain region 1). Between the p-type base region 4 and the $n^-$-type drift region 2b, n-type current spreading regions 3 and $p^+$-type regions 21, 22 may be provided. In this instance, the $n^-$-type drift region 2b is a portion of the $n^-$-type epitaxial layer 33 excluding the n-type current spreading regions 3 and the $p^+$-type regions 21, 22. The n-type current spreading regions 3 and the $p^+$-type regions 21, 22 are provided at deep positions closer to the $n^+$-type drain region 1 than are bottoms of the trenches 7.

The n-type current spreading regions 3 constitute a so-called current spreading layer (CSL) that reduces carrier spreading resistance. The $p^+$-type regions 21, 22 have a function of mitigating electric field applied to the gate insulating films 8 at the bottoms of the trenches 7. The $p^+$-type regions 21 are provided separate from the p-type base region 4 and face the bottoms of the trenches 7 in a depth direction, respectively. The $p^+$-type regions 21 may be in contact with the bottoms of the trenches 7, respectively. One of the $p^+$-type regions 22 is provided between an adjacent two of the trenches 7, separate from the trenches 7 and the $p^+$-type regions 21, and in contact with the p-type base region 4.

The p-type base region 4 is provided between the front surface of the semiconductor chip 30 and the $n^-$-type drift region 2b. The p-type base region 4 is a portion of the p-type epitaxial layer 34 excluding the $n^+$-type source regions 5 and the $p^{++}$-type contact regions 6. The $n^+$-type source regions 5 and the $p^{++}$-type contact regions 6 are selectively provided between the front surface of the semiconductor chip 30 and the p-type base region 4. The $n^+$-type source regions 5 and the $p^{++}$-type contact regions 6 are in contact with the p-type base region 4 and are in ohmic contact with ohmic electrodes 13 in contact holes of a later-described interlayer insulating film 11.

The $p^{++}$-type contact regions 6 may be omitted. In an instance in which the $p^{++}$-type contact regions 6 are omitted, instead of the $p^{++}$-type contact regions 6, the p-type base region 4 are in ohmic contact with the ohmic electrodes 13. The n-type current spreading regions 3, the $p^+$-type regions 21, 22, the $n^+$-type source regions 5, and the $p^{++}$-type contact regions 6 are diffused regions formed by ion implantation and are selectively provided in the epitaxial layer 35. The trenches 7 penetrate through the $n^+$-type source regions 5 and the p-type base region 4 and reach the n-type current spreading regions 3 (in an instance in which the n-type current spreading regions 3 are omitted, the $n^-$-type drift region 2b).

In the trenches 7, the gate electrodes 9 are provided via the gate insulating films 8, respectively. The interlayer insulating film 11 is provided on the front surface of the semiconductor chip 30 and covers the gate electrodes 9. In an entire area between the interlayer insulating film 11 and a later-described front electrode 14, for example, a barrier metal 12 that prevents diffusion of metal atoms from the front electrode 14 to the gate electrodes 9 may be provided. The ohmic electrodes 13 are constituted by a silicide film provided on the front surface of the semiconductor chip 30, in the contact holes of the interlayer insulating film 11. The ohmic electrodes 13 are electrically connected to the p-type base region 4, the $n^+$-type source regions 5, and the $p^{++}$-type contact regions 6.

The front electrode 14 is provided in substantially an entire area of the front surface of the semiconductor chip 30, in the active region 41, so as to be embedded in the contact holes of the interlayer insulating film 11. The front electrode 14 are electrically connected to the p-type base region 4, the $n^+$-type source regions 5, and the $p^{++}$-type contact regions 6, via the ohmic electrodes 13. The barrier metal 12, the ohmic electrodes 13, and the front electrode 14 function as a source electrode. A back electrode 15 is provided in an entire area of the back surface (back surface of the $n^+$-type starting substrate 31) of the semiconductor chip 30 and is electrically connected to the n$^+$-type drain region 1. The back electrode 15 functions as a drain electrode.

Figure 5:
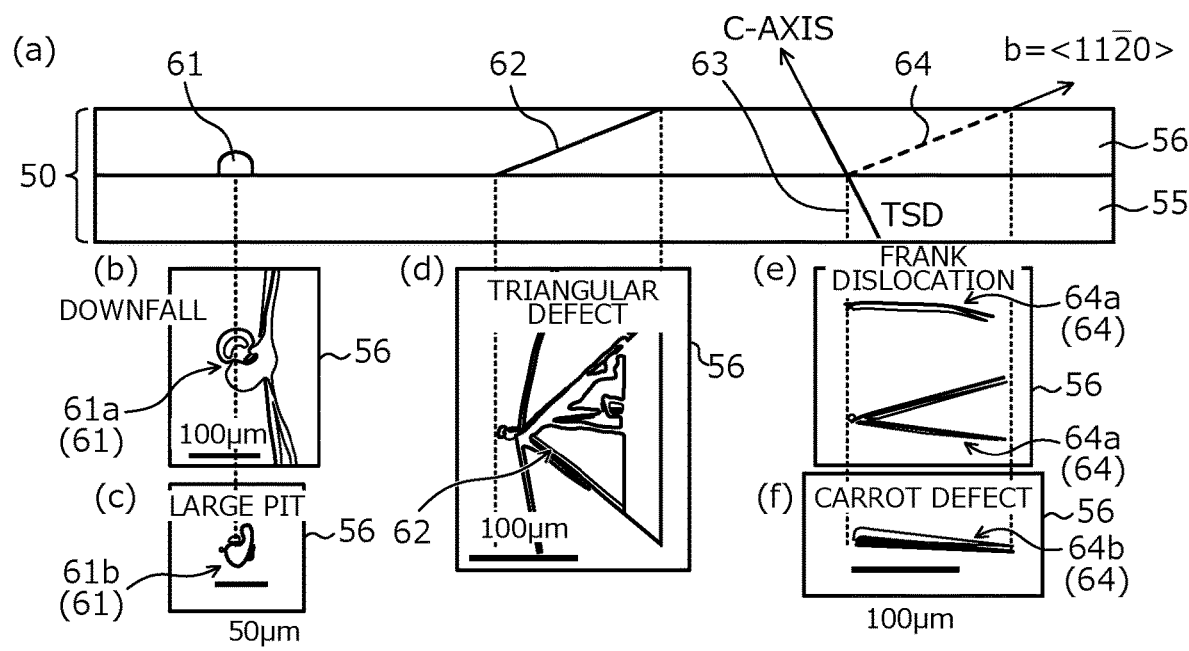
FIG. 5 is a diagram schematically depicting shapes of crystal defects that may be detected by the process at step S3 in FIG. 4.
Figure 6:
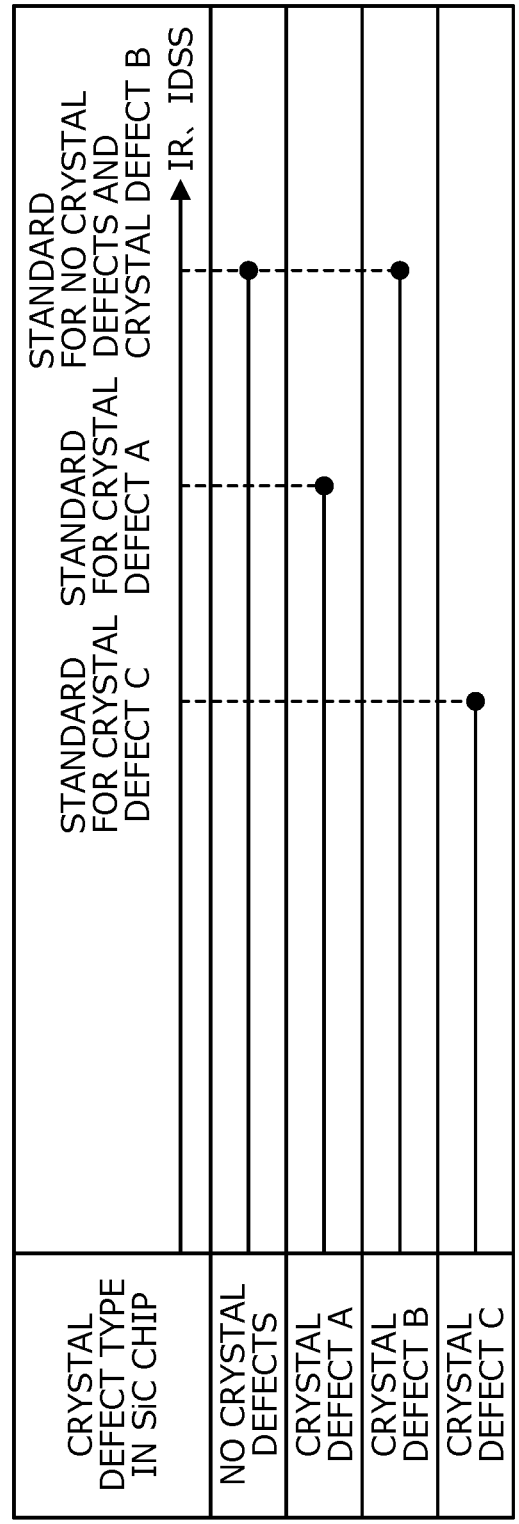
FIG. 6 is a chart depicting an example of determination standards for step S8 in FIG. 4.

Next, a method of manufacturing the silicon carbide semiconductor device 10 according to the embodiment is described. FIG. 4 is flowchart depicting an outline of the method of manufacturing the silicon carbide semiconductor device according to the embodiment. FIG. 5 is a diagram schematically depicting shapes of crystal defects that may be detected by the process at step S3 in FIG. 4. In FIG. 5, reference character (a) shows a cross-sectional view of the semiconductor wafer 50 in which crystal defects are formed while reference characters (b), (c), (d), (e), and (f) show the crystal defects formed in the semiconductor wafer 50, caused by different factors. FIG. 6 is a chart depicting an example of determination standards for step S8 in FIG. 4. FIG. 6 depicts determination standards for an instance in which the conforming product standard for the silicon carbide semiconductor device 10 is set by a leak current value.

First, the semiconductor wafer (SiC wafer) 50 containing silicon carbide as a semiconductor material is prepared (step S1: pre-process). The n$^+$-type starting wafer 55 is formed by epitaxially growing the epitaxial layer 56 (corresponds to the epitaxial layer 35 in FIG. 3) on the n$^+$-type starting wafer 55 (corresponds to the n$^+$-type starting substrate 31 in FIG. 3) containing silicon carbide (refer to FIG. 5). In the process at step S1, the n$^+$-type starting wafer 55 containing silicon carbide may be prepared and the semiconductor wafer 50 may be fabricated or the semiconductor wafer 50 itself may be purchased. Next, at a main surface (surface having the epitaxial layer 56) of the semiconductor wafer 50, location indicating marks (not depicted) are formed (step S2).

In the process at step S2, the location indicating marks (not depicted) are formed, in the dicing lines 52, at the main surface of the semiconductor wafer 50 by photolithography and etching. The location indicating marks are references for identifying locations (coordinates in directions parallel to the wafer surface) of crystal defects of the semiconductor wafer 50. In an instance in which, during the process at step S1, the dicing lines 52 are not formed in the semiconductor wafer 50 prepared, the dicing lines 52 (refer to FIG. 1) suffice to be formed at the main surface of the semiconductor wafer 50 by photolithography and etching after the process at step S1 but before the process at step S2.

Next, by crystal defect inspection equipment, the types, sizes (lengths, surface areas, etc.), and the location information of the crystal defects in and at the surface of the epitaxial layer 56 of the semiconductor wafer 50 are detected and obtained (step S3: detection process). The crystal defect inspection equipment, for example, is the SiC Wafer Inspection and Review System SICA88 manufactured by Lasertec Corporation. The crystal defects detected by the process at step S3 include a foreign particle defect 61, the triangular defect 62, and an extended defect 64 formed in the epitaxial layer 56 (refer to FIG. 5). Sizes and location information of these crystal defects, for examples, are obtained based on the location indicating mark formed by the process at step S2.

The foreign particle defect 61 is a downfall 61a (FIG. 5 (b)) caused by foreign particle (by-product due to decomposition of source gas, etc.) contamination during epitaxial growth of the epitaxial layer 56 and/or a large pit 61b caused by carbon (C) inclusion during the epitaxial growth of the epitaxial layer 56 (FIG. 5 (c)). The triangular defect 62 is a polymorphic triangular stacking fault newly formed due to polymorph (crystalline polymorph) inclusion during epitaxial growth (FIG. 5 (d)). The foreign particle defect 61 and the triangular defect 62 are killer defects that cause significant reduction of the capability, reliability, and electrical characteristics of the silicon carbide semiconductor device 10.

The extended defect 64 is a Frank dislocation or a carrot defect having a stacking fault formed at a substrate bottom surface or crystal surface (crystal surface orthogonal to a direction (direction parallel to C-axis) of a dislocation line of a TSD and parallel to Burgers vector b=<11-20>) in the epitaxial layer 56, by a threading screw dislocation (TSD) in the n$^+$-type starting wafer 55 being propagated and extended during the epitaxial growth of the epitaxial layer 56. The Frank dislocation has a stacking fault of a single-layer. The carrot defect has a stacking fault formed three-dimensionally between partial dislocations propagated from a threading screw dislocation. The extended defect 64 may increase the leak current of the silicon carbide semiconductor device 10.

Next, various processes for forming a predetermined device element structure (refer to FIGS. 1 and 3) in each of the chip regions 51 of the semiconductor wafer 50 is performed (step S4: formation process). At this time, the device element structure need not be formed in any chip region 51 constituting a non-conforming chip after the process at later-described step S6. Next, the semiconductor wafer is cut (diced), thereby forming the chip regions 51 of the semiconductor wafer 50 into the individual semiconductor chips 30 (SiC chips, refer to FIG. 2) (step S5: cutting process). Next, based on the information obtained by the process at step S3, the semiconductor chips 30 free of predetermined crystal defects are identified as conforming product candidates while the remaining semiconductor chips 30 are removed as non-conforming chips (step S6: first identification process).

In particular, in the process at step S6, the semiconductor chips 30 free of the foreign particle defect 61 and the triangular defect 62 are identified as conforming product candidates. In other words, the semiconductor chips 30 free of all three of the foreign particle defect 61, the triangular defect 62, and the extended defect 64, and the semiconductor chips 30 containing only the extended defect 64 (the Frank dislocation 64a or the carrot defect 64b or both) are identified as conforming product candidates. While the extended defect 64 increases the leak current, adverse effects on electrical characteristics is relatively small. The inventors confirmed that the semiconductor chips 30 satisfying the same conforming product standard as the semiconductor chips 30 free of crystal defects are present among the semiconductor chips 30 containing only the extended defect 64.

The semiconductor chips 30 containing only the extended defect 64 all become conforming product candidates regardless of the size, the number, or the type of the extended defect 64, or location at the surfaces of the semiconductor chips 30. On the other hand, the semiconductor chips 30 containing at least one of the foreign particle defect 61 or the triangular defect 62 that are killer defects has a high probability of not satisfying the same conforming product standard as the semiconductor chips 30 free of crystal defects and therefore, are removed as non-conforming chips without performing the process at step S6 or subsequent processes. In this manner, in the process at step S6, the semiconductor chips 30 containing a killer defect are removed, whereby a total process time for later-described step S7 may be reduced and throughput may be enhanced.

Next, for each of the semiconductor chips 30 set as a conforming product candidate by the process at step S6, a predetermined conduction test is performed and electrical characteristics are checked (step S7: checking process). At step S7, for comparison with the conforming product standard by the process at later-described step S8, the same conduction test at the time when the conforming product standard was obtained is performed and electrical characteristics are thereby obtained. The conforming product standard is a limit value (upper limit or lower limit or both) of various characteristics that can ensure a predetermined amount of resistance and a predetermined reliability of the silicon carbide semiconductor device 10, and is set by a condition that is strictest of all results obtained by, for example, performing, as preliminary tests, at least one test to measure electrical characteristics to evaluate capability and at least one test to evaluate reliability.

In an instance in which the conforming product standard is set by a leak current value (in an instance of a SBD, a value of reverse recovery current Ir and in an instance of a MOSFET, a value of drain current Idss), the electrical characteristics for evaluating capability, for example, are forward surge current capability (IFSM capability), reverse recovery capability, avalanche capability, reverse bias safety operation area (RBSOA), and short circuit safe operation area (SCSOA). In this instance, the upper limit of the conforming product standard is the leak current value for the rating.

Further, in an instance in which the conforming product standard is set by a leak current value, the electrical characteristics for evaluating capability, for example, are forward surge current capability during continuous conduction, continuous conduction life span, reverse recovery capability during continuous conduction, avalanche capability during continuous conduction, RBSOA during continuous conduction, and SCSOA during continuous conduction. In this instance, the conforming product standard is a range of the leak current value when an amount of fluctuation from a design value of these electrical characteristics is at most a predetermined ratio (for example, 20%). In a MOSFET, further, when the conforming product standard is set by a leak current value, the electrical characteristics for evaluating capability are the dielectric breakdown capability of the gate insulating films 8 (refer to FIG. 3). The electrical characteristics for evaluating capability in an instance in which the conforming product standard is set by a leak current value are only examples, are not limited to the described examples, and may be other than the described examples. The described examples or that other than the described examples may be applied as suitable according to circumstances.

The dielectric breakdown capability of the gate insulating films 8, for example, is time zero dielectric breakdown (TZDB) capability, time dependent dielectric breakdown (TDDB) capability due to application of gate voltage while the drain and source are grounded, and time dependent dielectric breakdown (DTDDB) capability due to application of gate voltage and application of a predetermined voltage (for example, 1200V) to the drain while the source is grounded. In this instance, the conforming product standard is a range of a leak current value (value of drain current Idss) when the amount of fluctuation from a design value of the dielectric breakdown capability of the gate insulating films 8 is at most a predetermined ratio (for example, 20%). The dielectric breakdown capability of the gate insulating films 8 is only an example, is not limited to the described example, and may be other than the described example. The described example or other than the described examples may be applied as suitable according to circumstances.

Further, in an instance in which the conforming product standard is set by a leak current value, a test for evaluating reliability, for example, is a high temperature and high voltage application test that evaluates electrical characteristics by applying high voltage under a high temperature; a high temperature, high humidity, high voltage application test that evaluates electrical characteristics by applying high voltage under a high temperature and high humidity; a power cycle test that evaluates operating life span due to thermal fatigue by intermittently conducting to repeatedly alternate between self-heating and cooling; and a low temperature and high voltage application test that evaluates electrical characteristics by applying high voltage under a low temperature. In this instance, the conforming product standard is a range of a leak current value when the amount of fluctuation from a design value of the electrical characteristics obtained by these tests is at most a predetermined ratio (for example, 20%). The test for evaluating reliability in an instance in which the conforming product standard is set by a leak current value is not limited to the examples described above. These are only examples and the test is not limited to the described examples and may be other than the described examples. The described examples or that other than the described examples may be applied as suitable according to circumstances.

Here, while not described, other than the tests for evaluating capability and evaluating reliability described above, other types of tests are performed to confirm or evaluate conditions that do not affect capability. These other tests, in an instance in which no trouble occurs even when performed in a state of the semiconductor wafer 50, may be performed at a timing after the process at step S5 but before the process at step S6, or may be performed to the semiconductor chips 30 after the process at step S6. At step S7, a test that is difficult to perform in the state of the semiconductor wafer 50 or a test that takes time when performed in the state of the semiconductor wafer 50 such as in an instance in which heating or cooling is performed until a predetermined temperature is reached suffices to be performed.

Next, based on the results at step S7 and the conforming product standard obtained in advance, a standard judgment for judging the semiconductor chips 30 set as the conforming product candidates is performed (step S8). In the process at step S8, one conforming product standard (first standard) is applied to all the semiconductor chips 30 that are the conforming product candidates. A conforming product standard (second standard) of a condition different from the conforming product standard (first standard) applied to the semiconductor chips 30 free of crystal defects may be applied to the semiconductor chips 30 containing only the extended defect 64. Thereafter, based on the results at step S8, the semiconductor chips 30 satisfying the conforming product standard are identified as conforming products (conforming chips) (step S9: second identification process), whereby evaluation of the silicon carbide semiconductor device 10 is complete.

In the method of manufacturing the silicon carbide semiconductor device 10 according to the embodiment described above, multiple conforming product standards (second standards) may be prepared based on the size, the number, and the type of crystal defects contained in the semiconductor chips 30 and the locations (the active region 41, the edge termination region 42) thereof at the surfaces of the semiconductor chips 30, etc. (refer to FIG. 6). In FIG. 6, while an instance in which conforming product standards are prepared for crystal defects A, B, C, respectively, is depicted, the number of conforming product standards may be increased or decreased. These conforming product standards are set according to the electrical characteristics of the semiconductor chips containing the applied crystal defects. By preparing multiple conforming product standards, the semiconductor chips 30 satisfying conforming product standard may be sorted according to application.

Further, in an instance in which multiple conforming product standards are prepared, step S6 is omitted and in the process at step S7, the electrical characteristics of all the semiconductor chips 30 cut from the semiconductor wafer 50 may be checked. In this instance, as the crystal defects (in FIG. 6, the crystal defects are indicated as A, B, C) for which conforming product standards are prepared, in addition to the extended defect 64 (the Frank dislocation 64a, the carrot defect 64b), the triangular defect 62, the extended defect 64, and the foreign particle defect 61, scratches (damage, not depicted) of the surface of the semiconductor wafer 50, large triangular defects (not depicted) that are triangular stacking faults formed by unevenness occurring due to step bunching at the surface with a defect dislocation or a foreign particle as a point of origin, etc. may be further added.

Further, the conforming product standard (value of leak current) applied to the semiconductor chips containing a crystal defect, for example, may be set based on a withstand voltage test that passes a large current of about 10 mA. The current passed in a normal withstand voltage test is about 1 mA. In a MOSFET, the conforming product standard applied to the semiconductor chips containing a crystal defect may be set as a range of the leak current value when the amount of fluctuation of a gate threshold voltage Vth is within ±100 mV. Regardless of the presence or absence of crystal defects, the conforming product standard may be set by a value of gate leak current Igss, or a voltage value of a forward voltage Vf, a reverse recovery voltage Vr (withstand voltage), an ON voltage Von, the gate threshold voltage Vth, or a breakdown voltage BVdss, instead of the leak current value.

In an instance in which multiple conforming product standards are prepared, for example, the conforming product standards are set in the following manner. In an instance in which the capability and/or reliability slightly decreases when the crystal defect A is contained, a conforming product standard that is slightly strict compared to the conforming product standard applied to the semiconductor chips 30 (no crystal defects) free of crystal defects is applied to the semiconductor chips 30 containing the crystal defect A. In an instance in which the capacity and/or the reliability do not substantially differ from those of a conforming product even when the crystal defect B is contained, the same conforming product standard as that for the semiconductor chips 30 free of crystal defects is applied to the semiconductor chips 30 containing the crystal defect B. In an instance in which the capability and/or reliability significantly decreases when the crystal defect C is contained, a conforming product standard that is strict compared to the conforming product standard applied to the semiconductor chips 30 free of crystal defects is set for the semiconductor chips 30 containing the crystal defect C.

In the present embodiment, the method of manufacturing the silicon carbide semiconductor device 10 described may be implemented by executing a prepared program on a computer such as a personal computer or a workstation, a database server, a webserver, etc. The program and the conforming product standard for the silicon carbide semiconductor device 10 obtained in advance are recorded to a computer-readable recording medium such as a solid state drive (SSD), a hard disk, a Blu-ray Disc (BD) (registered trademark)), a flexible disk, a USB flash memory, a CD-ROM, a MO, a DVD, or the like and are executed by being readout from the recording medium by the computer. Further, the program may be a transmitted medium that may be distributed via a network such as the Internet.

As described above, according to the embodiment, a crystal defect (foreign particle defect, triangular defect, extended defect) in the epitaxial layer of the semiconductor wafer is detected and based on the type and location of the crystal defect, a semiconductor chip free of a predetermined crystal defect (here, a foreign particle defect and a triangular defect) is identified as a conforming product candidate. Not only the semiconductor chips free of crystal defects but also semiconductor chips containing crystal defects (here, extended defects) excluding the predetermined crystal defects described above are set as conforming product candidates and from these conforming product candidates, conforming products are identified based the conforming product standard obtained in advance.

In the conventional method (refer to FIG. 7), all semiconductor chips detected containing crystal defects are removed as non-conforming chips without exception whereas according to the embodiment, similarly to the semiconductor chips free of crystal defects, the electrical characteristics check and the conforming product standard judgment are performed for the semiconductor chips containing only the extended defects. As a result, a portion of the semiconductor chips regarded as non-conforming chips in the conventional method may be set as conforming products. Therefore, the conforming product rate may be enhanced and chip cost may be reduced.

Further, according to the embodiment, the types and locations of the crystal defects are obtained at the semiconductor wafer state, whereby after the semiconductor wafer is diced but before the electrical characteristics of the semiconductor chip are checked, semiconductor chips containing killer defects (foreign particle defects and triangular defects) having a high probability of significantly reducing the electrical characteristics may be removed as non-conforming chips without checking the electrical characteristics. The total process time of the process of checking the electrical characteristics of the semiconductor chip may be reduced and throughput may be enhanced.

In the foregoing, the present invention, without limitation to the embodiments described above, may be variously modified within a range not departing from the spirit of the invention. For example, in the embodiments described above, in the process at step S6, while Frank dislocations and carrot defects are regarded as crystal defects that may be contained in a semiconductor chip set as a conforming product candidate, without limitation hereto, provided the crystal defects are capable of satisfying the same conforming product standard as that for semiconductor chips free of crystal defects, said crystal defects may be contained in semiconductor chips set as conforming product candidates. Further, the present invention is similarly implemented when the conductivity types (n-type, p-type) are reversed. Further, a portion of or the entire checking process of the electrical characteristics of the semiconductor chips may be implemented in the semiconductor wafer state before dicing. Further, as the conforming product standard, provided the electrical characteristics are related to capability and/or reliability, any electrical characteristics may be adopted.

According to the invention described above, the standard judgment is performed with respect to a semiconductor chip containing only crystal defects (extended defects) of a predetermined type among the crystal defects detected by the detection process to determine whether said semiconductor chip is a conforming product like a semiconductor chip free of crystal defects. As a result, a portion of the semiconductor chips regarded as non-conforming chips in the conventional method (refer to FIG. 7) may be set as conforming products.

The method of manufacturing the silicon carbide semiconductor device according to the present invention achieves an effect in that the conforming product rate may be enhanced and chip cost may be reduced.

As described above, the method of manufacturing the silicon carbide semiconductor device according to the present invention is useful in instances in which semiconductor chips (silicon carbide semiconductor devices) are mass produced from 6-inch semiconductor wafers and is particularly suitable for SBDs and MOSFETs.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A method of manufacturing a silicon carbide semiconductor device fabricated on each of a plurality of semiconductor chips formed by epitaxially growing an epitaxial layer on a starting substrate containing silicon carbide, the method comprising:
   preparing, as a pre-process a semiconductor wafer in which the epitaxial layer is epitaxially grown on a starting wafer containing the silicon carbide and constituting the starting substrate;
   detecting a plurality of types of crystal defects of the epitaxial layer as a detection process;
   forming a device element structure in the semiconductor wafer as a formation process;
   dicing the semiconductor wafer into the plurality of semiconductor chips as a cutting process, the cutting process being performed after the formation process;
   identifying, as a first identification process, as a conforming product candidate, one or more first semiconductor chips that are free of one or more specific types of crystal defects among the plurality of types of crystal defects detected by the detection process;
   checking, as a checking process, electrical characteristics of the one or more first semiconductor chips identified by the first identification process; and
   identifying, as a second identification process, one or more second semiconductor chips to be a conforming product, from the one or more first semiconductor chips identified by the first identification process, the one or more second semiconductor chips being identified based on a result of the checking process and a predetermined standard obtained in advance.

2. The method according to claim 1, wherein
in the first identification process, the one or more first semiconductor chips each identified as the conforming product candidate are free of a foreign particle defect and free of a triangular defect.

3. The method according to claim 1, wherein
in the first identification process, of the plurality of semiconductor chips, one or more third semiconductor chips that are free of any type of crystal defects and/or one or more fourth semiconductor chips that contain only a Frank dislocation and/or a carrot defect among the plurality of types of crystal defects are each identified as the conforming product candidate, and a remainder of the plurality of semiconductor chips is set as non-conforming chips.

4. The method according to claim 1, wherein
a first standard set with the electrical characteristics of a third semiconductor chip that is free of any type of crystal defects as a reference is obtained as the predetermined standard, and
in the second identification process, the first standard is applied to all the one or more first semiconductor chips identified by the first identification process.

5. The method according to claim 1, wherein
a first standard set with the electrical characteristics of a third semiconductor chip that is free of any type of crystal defects as a reference, and one or more second standards set with the electrical characteristics of a fourth semiconductor chip that contains at least one specific type of crystal defect are obtained as the predetermined standard, and
in the second identification process, of the one or more first semiconductor chips identified by the first identification process, the one or more second standards are applied to the fourth semiconductor chip that contains the at least one specific type of crystal defect.

6. The method according to claim 5, wherein
the one or more second standards are set based on a size, a quantity, a type, and a location of crystal defects contained in the plurality of semiconductor chips.

7. The method according to claim 1, further comprising
forming a location indicating mark at a surface of the semiconductor wafer performed between the pre-process and the detection process.

* * * * *